United States Patent [19]

Carlson

[11] Patent Number: 4,622,527
[45] Date of Patent: Nov. 11, 1986

[54] ISOLATION OF RF SIGNALS IN A RF SHIELD APERTURE

[75] Inventor: David J. Carlson, Marion County, Ind.

[73] Assignee: RCA Corporation, Princeton, N.J.

[21] Appl. No.: 746,145

[22] Filed: Jun. 20, 1985

[51] Int. Cl.$^4$ ............................................... H03H 7/01
[52] U.S. Cl. ...................... 333/182; 333/12; 333/185; 364/424
[58] Field of Search .................. 333/12, 167, 181–185, 333/175–176, 24 R, 24 C; 361/424

[56] References Cited

U.S. PATENT DOCUMENTS

| | | | |
|---|---|---|---|
| 2,272,066 | 2/1942 | Peterson | 333/24 R |
| 3,516,026 | 6/1970 | Curran et al. | 333/12 |
| 3,859,558 | 1/1975 | Harada et al. | 333/181 X |
| 3,913,038 | 10/1975 | Carter | 333/167 |

FOREIGN PATENT DOCUMENTS 778573 7/1957 United Kingdom ................ 333/182

OTHER PUBLICATIONS

Random House College Dictionary, Revised Edition, pp. 304, 290 (not dated).
Copending U.S. patent application 634,330, (Hettiger), filed on July 25, 1984, and assigned to the same assignee.

Primary Examiner—Marvin L. Nussbaum
Attorney, Agent, or Firm—P. J. Rasmussen; P. M. Emanuel; T. F. Lenihan

[57] ABSTRACT

An apparatus is disclosed which presents a high impedance to unwanted RF signals which may be otherwise coupled to jumper wires which traverse the boundary between RF shielded areas. Specifically, a conductor for connecting two circuits separated by a shield wall is surrounded by a ferrite material which is positioned to extend through an aperture of the RF shield.

4 Claims, 3 Drawing Figures

ISOLATION OF RF SIGNALS IN A RF SHIELD APERTURE

BACKGROUND OF THE INVENTION

This invention relates to suppression of undesirable radio frequency (RF) signals in apparatus such as television receiver circuitry. Specifically, apparatus according to the invention presents a high impedance to RF signals which may be coupled to jumper wires which traverse the boundary between RF shielded area.

Radio frequency (RF) energy may be coupled from one circuit to another via exposed component leads by unintended coupling via stray circuit capacitance radiation. Such unwanted radio frequency signals may cause interference with signal processing circuitry and produce undesired effects, e.g., in a television receiver in the picture and sound perceived by the viewer.

A solution to the problem is to isolate the offending RF noise signal generating circuit, or the sensitive circuit receiving the noise signals, within a metal RF shield. It is usually necessary, however, to couple both signals and power between the shielded circuit and circuits external to the RF shield enclosure. Necessary signals and power may be coupled to and from the circuit enclosed within the RF shield is by providing apertures through the shield, sometimes called "mouseholes", through which to bring power and signal jumper wires to be connected to the isolated circuit. The mouseholes are, however, a breach in the RF shield which may allow stray RF energy to escape via the exposed jumper wires. Feed-through capacitors may be used to couple signals and power to and from the shielded circuit while significantly reducing interference from stray RF energy. Basically, a feed-through capacitor comprises a center conductor surrounded by a dielectric which is itself encased in a cylindrical metal outer conductor. The feedthrough capacitor extends through a hole in the shield and the outer conductor is soldered or otherwise attached to the shield. Feed-through capacitors are themselves expensive and do not readily lend themselves to automated assembly techniques. Attempts have been made to suppress the unwanted RF signals by placing ferrite beads in the RF signal path on jumper wires proximate to the shield wall on both sides, as taught in U.S. Pat. No. 3,913,038 (Carter). Unfortunately, this method still leaves some jumper wire exposed in and near the mousehole and the immediately adjacent area which may couple unwanted RF signal energy to nearby circuits.

SUMMARY OF THE INVENTION

In accordance with an aspect of the present invention, an oblong ferrite-surrounded conductor is positioned to extend through a mousehole aperture in an RF shielded enclosure to couple signals to or from the enclosure while substantially suppressing any undesirable RF signal energy which may be coupled to the conductor.

In accordance with another aspect of the present invention, the conductor is embedded in ferrite material to form a "chip" which is suitable for automatic assembly and wave-soldering.

DESCRIPTION OF THE PREFERRED EMBODIMENT

Figure 1:
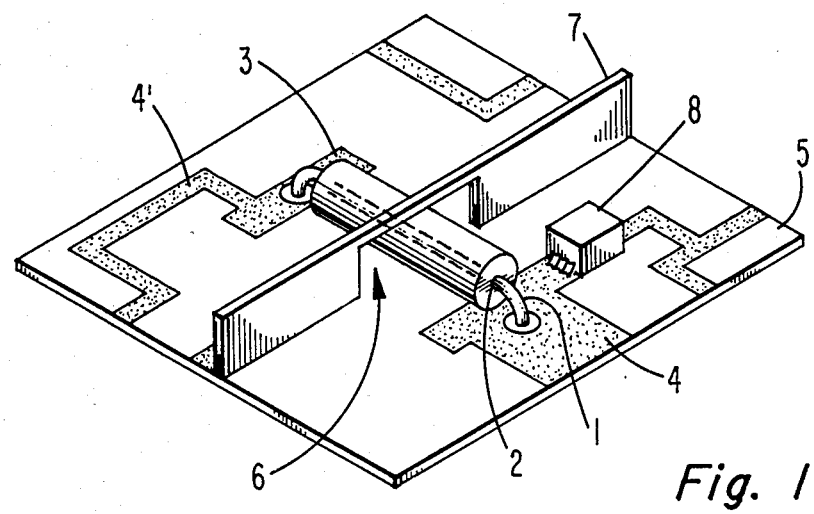
FIGS. 1 and 3 are isometric views of respective embodiments of the present invention.

Referring to FIG. 1, two circuits are shielded from one another by a metal shield of which 7 is a wall. Jumper wire 1, carrying, for example, supply voltage, passes through a hole 6, coterminous with the surface of the printed circuit board and sometimes referred to as a mousehole, and is connected at its opposite ends to conductors 4 and 4' in the respective circuits. Jumper wire 1 passes through an axial hole 2 of ferrite bead 3 so that ferrite bead 3 surrounds jumper wire 1 via axial hole 2 and extends through the mousehole on both sides. Thus, there is no exposed jumper wire in or proximate to the mousehole because the ferrite is continuous from one side of the RF shield to the other. The elimination of exposed wire leads in and near the mousehole reduces the possibility of unwanted coupling of RF energy between circuits 4 and 4', on opposite sides of RF shields, because the ferrite acts as a high impedance to unwanted RF signals. An advantage of using a ferrite-surrounded conductor assembly over a feed-through capacitor is that the feedthrough capacitor has an outer conductor which must make good electrical connection to the RF shield wall either by mechanical means or by soldering, whereas the ferrite-surrounded conductor assembly does not require connection to the RF shield, thus eliminating a costly and time consuming step in the circuit board assembly procedure.

The prior art as taught by Carter uses two ferrite beads positioned on respective sides of an RF shield wall aperture to suppress unwanted RF signals. The single cylindrical ferrite bead projecting through the shield wall as shown in FIG. 1 replaces the two bead arrangement described above, thus effecting a cost and labor saving, while improving shielding performance by eliminating exposed conductors in and adjacent to the aperture. An arrangement according to Carter, in contrast, requires a greater number of hand operations to mount the two beads instead of only one, and undesirably exposes a length of conductor in and near the aperture between the two beads to the unwanted RF signal energy. Ferrite bead 3 extending through the shield wall can be used alone or in combination with a single capacitor 8, such as a chip capacitor, to produce a half section pi-type filter, or with a chip capacitor on each side of the RF shield wall to form a full section pi-type filter. The choice of filter type is dependent upon the characteristics of the application.

Figure 2:
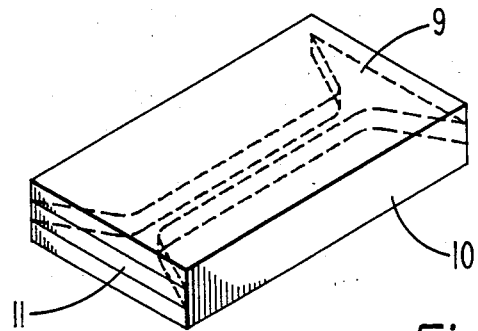
FIG. 2 is an isometric view of a surface mountable ferrite-embedded conductor chip suitable for use in accordance with this invention.

FIG. 2 shows a surface-mountable ferrite-surrounded conductor chip component of the type described in copending U.S. patent application Ser. No. 634,330 (Hettiger) filed on July 25, 1985 and assigned to the same assignee as the subject application. Such ferrite bead comprises a conductor 9 embedded in a ferrite material 10 and having exposed metallic ends 11 to permit soldering of the component to external conductors, for example, to printed circuit board conductor pads.

Figure 3:
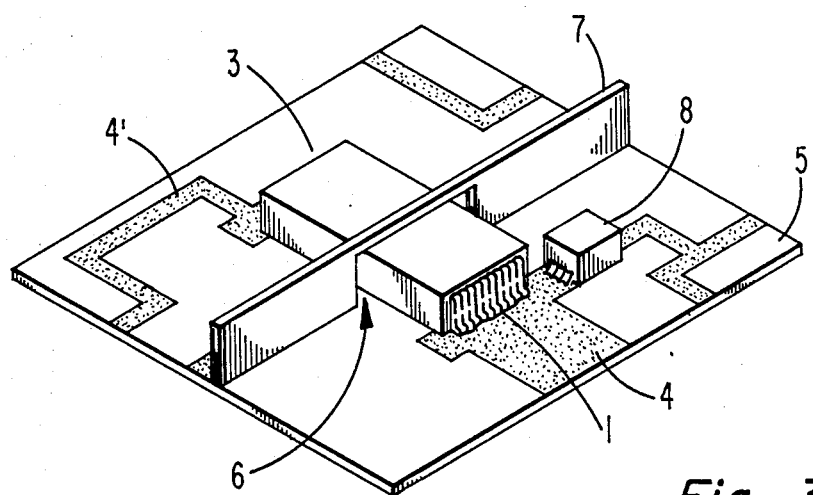

Referring to the embodiment of FIG. 3, the reference numbers shown correspond to similar elements in FIG. 1. The oblong cylindrical ferrite and wire assembly of FIG. 1 have been replaced in FIG. 3 with a ferrite chip component 3 of the type shown in FIG. 2. This embodiment is advantageous over that shown in FIG. 1 since it allows placement of the ferrite chip component by automatic component mounting apparatus, thus eliminating costly hand mounting of ferrite beads on wire conductors, and allows for the subsequent wave-soldering of the component to the printed circuit board.

What is claimed is:

1. RF signal suppression apparatus comprising:
   a printed circuit board;
   an RF shield, mounted on said printed circuit board, and having an aperture therethrough;
   said aperture being coterminous with the surface of said printed circuit board;
   an oblong ferrite bead and conductor assembly including an oblong ferrite bead having a hole therethrough along its major axis; a conductor extending through said hole in said oblong ferrite bead and projecting out both ends of said bead to allow connection to external conductors of circuits on opposite sides of said RF shield; said oblong ferrite bead and conductor assembly being positioned in said RF shield aperture with said ferrite bead extending beyond both sides of said RF shield; and
   a capacitor coupled between one end of said conductor of said oblong ferrite bead and conductor assembly and a point of reference potential, said capacitor in combination with said oblong ferrite bead and conductor assembly forming a filter circuit for passing low frequency signals between said circuits on opposite sides of said RF shield but inhibiting the coupling of RF signals between said circuits; said oblong ferrite bead and conductor assembly being affixed to said printed circuit board only.

2. Apparatus according to claim 1 wherein: said oblong ferrite bead and conductor assembly is a surface mountable ferrite chip component.

3. A feedthrough arrangement for mounting on a printed circuit board which suppresses unwanted RF signals comprising:
   a cylindrical ferrite bead having an axial hole;
   a conductor passing through said axial hole;
   said cylindrical ferrite bead being positioned to extend through an aperture in an RF shield, said aperture being coterminous with the surface of said printed circuit board, said conductor being connected to circuits on opposite sides of said RF shield; and
   a capacitor coupled between one end of said and conductor assembly and a point of reference potential;
   said capacitor in combination with said cylindrical ferrite bead and conductor assembly forming a filter circuit for passing low frequency signals between said circuits on opposite sides of said RF shield but inhibiting the coupling of RF signals between said circuits;
   said cylindrical ferrite bead and conductor assembly being affixed to said printed circuit board only.

4. A signal coupling arrangement exhibiting a high impedance to unwanted signals in the RF band of frequencies comprising:
   a printed circuit board;
   an RF shield mounted on said printed circuit board and having an aperture coterminous with the surface of said printed circuit board;
   a surface mountable ferrite chip component comprising a conductor embedded in a ferrite material, said surface mountable ferrite chip component being positioned through said aperture, said conductor being connected to circuits on opposite sides of said RF shield to couple signals therebetween; and
   a chip capacitor coupled between one end of said conductor of said surface mountable ferrite chip component and a point of reference potential, said chip capacitor in combination with said surface mounted ferrite chip component forming a filter circuit for passing low frequency signals between said circuits on opposite sides of said RF shield but suppressing the coupling of RF signals between said circuits;
   said surface mountable ferrite chip component being affixed to said printed circuit board only.

* * * * *